(12) United States Patent
Dolinsky et al.

(10) Patent No.: US 9,869,781 B2
(45) Date of Patent: Jan. 16, 2018

(54) ACTIVE PULSE SHAPING OF SOLID STATE PHOTOMULTIPLIER SIGNALS

(71) Applicant: General Electric Company, Schenectady, NY (US)

(72) Inventors: Sergei Ivanovich Dolinsky, Clifton Park, NY (US); Jianjun Guo, Ballston Spa, NY (US)

(73) Assignee: General Electric Company, Niskayuna, NY (US)

( * ) Notice: Subject to any disclaimer, the term of this patent is extended or adjusted under 35 U.S.C. 154(b) by 452 days.

(21) Appl. No.: 14/088,124

(22) Filed: Nov. 22, 2013

(65) Prior Publication Data

US 2015/0144797 A1    May 28, 2015

(51) Int. Cl.

| | |
|---|---|
| G01T 1/24 | (2006.01) |
| G01J 1/44 | (2006.01) |
| G01T 1/20 | (2006.01) |
| H01L 31/10 | (2006.01) |
| H01L 31/11 | (2006.01) |
| G01T 1/208 | (2006.01) |
| H01L 31/102 | (2006.01) |
| H01L 31/115 | (2006.01) |

(52) U.S. Cl.
CPC .......... *G01T 1/248* (2013.01); *G01J 1/44* (2013.01); *G01T 1/2006* (2013.01); *G01T 1/208* (2013.01); *G01T 1/247* (2013.01); *G01T 1/249* (2013.01); *H01L 31/102* (2013.01); *H01L 31/115* (2013.01); *G01J 2001/4466* (2013.01)

(58) Field of Classification Search
CPC ......... G01T 1/2018; G01T 1/208; G01T 1/20; G01T 1/248; G01T 1/2006; G01T 1/247; G01T 1/249; G01J 1/44; G01J 2001/4466; H01L 31/102; H01L 31/115

USPC ............... 250/366, 370.11, 370.08, 370.09
See application file for complete search history.

(56) References Cited

U.S. PATENT DOCUMENTS

| | | | |
|---|---|---|---|
| 6,384,663 B2 | 5/2002 | Cova et al. | |
| 6,541,752 B2 | 4/2003 | Zappa et al. | |
| 7,719,029 B2 | 5/2010 | Itzler | |
| 8,158,951 B2 | 4/2012 | Bal et al. | |
| 8,259,293 B2 | 9/2012 | Andreou et al. | |
| 8,390,791 B2 | 3/2013 | Vert et al. | |
| 8,884,240 B1 * | 11/2014 | Shah et al. | 250/370.14 |

(Continued)

FOREIGN PATENT DOCUMENTS

WO    2011117309 A2    9/2011

OTHER PUBLICATIONS

Christian, J.F. et al., "Advances in CMOS solid-state photomultipliers for scintillation detector applications", 2010, Nuclear Instruments & Methods in Physics Research, Elsevier, vol. 624 No. 2, pp. 449-458.*

(Continued)

*Primary Examiner* — David Porta
*Assistant Examiner* — Blake Riddick
(74) *Attorney, Agent, or Firm* — Pabitra K. Chakrabarti (57) ABSTRACT

Photomultipliers are disclosed which comprise circuitry for detecting photo electric events and generating short digital pulses in response. In one embodiment, the photomultipliers comprise solid state photomultipliers having an array of microcells. The microcells, in one embodiment, in response to incident photons, generate a digital pulse signal having a duration of about 2 ns or less.

16 Claims, 7 Drawing Sheets

(56) References Cited

U.S. PATENT DOCUMENTS

| | | | |
|---|---|---|---|
| 9,417,326 B2* | 8/2016 | Niclass | G01S 7/4814 |
| 9,419,635 B2* | 8/2016 | Kumar | G01T 1/1647 |
| 2003/0105397 A1 | 6/2003 | Tumer et al. | |
| 2008/0203309 A1* | 8/2008 | Frach | G01T 1/1642 |
| | | | 250/362 |
| 2008/0240341 A1* | 10/2008 | Possin et al. | 378/19 |
| 2008/0308738 A1* | 12/2008 | Li et al. | 250/370.11 |
| 2009/0121142 A1* | 5/2009 | Heismann et al. | 250/363.04 |
| 2010/0010343 A1* | 1/2010 | Daghighian et al. | 600/436 |
| 2010/0108900 A1* | 5/2010 | Burr et al. | 250/370.11 |
| 2010/0207027 A1* | 8/2010 | Marks et al. | 250/336.1 |
| 2011/0108702 A1* | 5/2011 | Jackson | H01L 27/1446 |
| | | | 250/207 |
| 2011/0233413 A1* | 9/2011 | Prescher | G01T 1/1642 |
| | | | 250/370.01 |
| 2012/0025074 A1 | 2/2012 | Barbi et al. | |
| 2012/0068050 A1* | 3/2012 | Mazzillo | G01J 1/46 |
| | | | 250/208.1 |
| 2012/0112083 A1 | 5/2012 | Zhang et al. | |
| 2012/0217386 A1* | 8/2012 | Ricci et al. | 250/252.1 |
| 2012/0267746 A1 | 10/2012 | Sanfilippo et al. | |
| 2013/0087710 A1* | 4/2013 | Zhang | G01T 1/1647 |
| | | | 250/362 |
| 2013/0099100 A1 | 4/2013 | Pavlov | |
| 2013/0099346 A1* | 4/2013 | Choong et al. | 257/437 |
| 2013/0153975 A1* | 6/2013 | Henseler | G01T 1/248 |
| | | | 257/290 |
| 2013/0300838 A1* | 11/2013 | Borowski | G01S 7/486 |
| | | | 348/46 |
| 2014/0048711 A1* | 2/2014 | Henseler | G01T 1/248 |
| | | | 250/362 |
| 2014/0070867 A1* | 3/2014 | Dutton | H03K 5/1534 |
| | | | 327/355 |
| 2014/0183339 A1* | 7/2014 | Dolinsky | G01T 1/2018 |
| | | | 250/208.2 |
| 2014/0226043 A1* | 8/2014 | Chinn | H04N 5/2258 |
| | | | 348/262 |
| 2014/0226166 A1* | 8/2014 | Kumar | G01T 1/1647 |
| | | | 356/601 |

OTHER PUBLICATIONS

Tyndall et al., "A High-Throughput Time-Resolved Mini-Silicon Photomultiplier With Embedded Fluorescence Lifetime Estimation in 0.13 μm CMOS", 2012, IEEE Transactions on Biomedical Circuits and Systems, 6 (6), pp. 562-570.*

Spinellia et al., "Actively Quenched Single-Photon Avalanche Diode for High Repetition Rate Time-Gated Photon Counting", American Institute of Physics, pp. 55-61, vol. 67, Issue 1 Jan. 1996.

Cova et al., "Avalanche Photodiodes and Quenching Circuits for Single-Photon Detection", Applied Optics, pp. 1956-1976, vol. 35, Issue 12, Apr. 20, 1996.

Zappa et al., "Fully-Integrated Active-Quenching Circuit for Single-Photon Detection", Green, pp. 1, Sep. 28, 2010.

PCT Search Report and Written Opinion from corresponding PCT Application No. PCT/US2014/050636 dated Nov. 25, 2014.

Christian, J.F. et al. "Advances in CMOS solid-state photomultipliers for scintillation detector applications", Nuclear Instruments & Methods in Physics Research, Elsevier, NL vol. 624, No. 2, Dec. 11, 2010, pp. 449-458.

* cited by examiner

ACTIVE PULSE SHAPING OF SOLID STATE PHOTOMULTIPLIER SIGNALS

BACKGROUND

The subject matter disclosed herein relates to detection systems for use in imaging systems, such as X-ray based and nuclear medicine imaging systems.

Diagnostic imaging technologies allow images of the internal structures of a patient to be obtained and may provide information about the function and integrity of the patient's internal structures. Diagnostic imaging systems may operate based on various physical principles, including the emission or transmission of radiation from the patient tissues. For example, X-ray based imaging systems may direct X-rays at a patient from some emission source toward a detector system disposed opposite the source across an imaged volume. Attenuation of the X-rays as they pass through the volume, and through any materials or tissues placed between the source and detector, may be determined and used to non-invasively form images of the interior regions of an imaged patient or object. Such attenuation information may be obtained at various angular displacements to generate depth information coincident with the attenuation information.

In addition, single photon emission computed tomography (SPECT) and positron emission tomography (PET) may utilize a radiopharmaceutical that is administered to a patient and whose breakdown results in the emission of gamma rays from locations within the patient's body. The radiopharmaceutical is typically selected so as to be preferentially or differentially distributed in the body based on the physiological or biochemical processes in the body. For example, a radiopharmaceutical may be selected that is preferentially processed or taken up by tumor tissue. In such an example, the radiopharmaceutical will typically be disposed in greater concentrations around tumor tissue within the patient.

In the context of PET imaging, the radiopharmaceutical typically breaks down or decays within the patient, releasing a positron which annihilates when encountering an electron and produces a pair of gamma rays moving in opposite directions in the process. In SPECT imaging, a single gamma ray is generated when the radiopharmaceutical breaks down or decays within the patient. These gamma rays interact with detection mechanisms within the respective PET or SPECT scanner, which allow the decay events to be localized, thereby providing a view of where the radiopharmaceutical is distributed throughout the patient. In this manner, a caregiver can visualize where in the patient the radiopharmaceutical is disproportionately distributed and may thereby identify where physiological structures and/or biochemical processes of diagnostic significance are located within the patient.

In the above examples of imaging technologies, a detector is employed which converts incident radiation to useful electrical signals that can be used in image formation. Certain such detector technologies employ solid state photomultipliers, which may be useful for detecting optical signals generated in a scintillator in response to the incident radiation. One issue that may arise is that, in certain detector technologies where solid state photomultipliers are employed, the pixels of the detectors generate signals having poor time resolution due to the long pulse of analog signal generated by the microcells within the solid state photomultiplier. Current approaches to addressing these issues, such as the use of digital solid state photomultiplier circuitry, however, are complex and add cost to the production of the detector components.

BRIEF DESCRIPTION

In one embodiment, a radiation detector is provided. The radiation detector comprises a scintillator layer configured to generate photons in response to incident radiation and a solid state photomultiplier comprising a plurality of microcells. Each microcell, in response to photons generated by the scintillator, is configured to generate a digital pulse signal having a duration of about 2 ns or less.

In a further embodiment, a solid state photomultiplier is provided. The solid state photomultiplier comprises a plurality of microcells. Each microcell is configured to generate an initial analog signal when exposed to optical photons. The microcell comprises electronic circuitry which compares the initial analog signal to comparison parameter and generates a digital output signal having a duration of about 2 ns or less based on the comparison.

In an additional embodiment, an imaging system is provided. The imaging system comprises a detector panel comprising a plurality of solid state photomultiplier modules. Each photomultiplier module comprises a plurality of microcells. Each microcell comprises a comparator configured to compare an initial analog signal generated by the respective microcell to a comparison threshold and a digital pulse generator configured to generate a digital pulse in response to an output of the comparator. The digital pulse has a duration of 2 ns or less. The imaging system further comprises data acquisition circuitry configured to acquire output signals from the detector panel. The output signals are derived using the digital pulses aggregated over respective solid state photomultipliers. The imaging system also comprises image reconstruction and processing circuitry configured to generate images based on the output signals acquired by the data acquisition circuitry and at least one image display workstation configured to display the images.

BRIEF DESCRIPTION OF THE DRAWINGS

These and other features, aspects, and advantages of the present invention will become better understood when the following detailed description is read with reference to the accompanying drawings in which like characters represent like parts throughout the drawings, wherein.

DETAILED DESCRIPTION

In accordance with the present disclosure, approaches for improving the usefulness of solid state photomultipliers (e.g., silicon photomultipliers (SiPM)) in conjunction with radiation detection are described.

As noted above, various radiation detection approaches exist that employ photo sensors incorporating a microcell (e.g., a single photon avalanche diodes (SPAD)) operating in Geiger mode. Certain of these approaches have been implemented in large area devices, such as may be used in nuclear detectors. For example, in SiPM devices, each individual microcell may be connected to a readout network via a quenching resistor exhibiting resistance between 100 kΩ to 1 MΩ. When a detected photon generates an avalanche event, the microcell is discharged down to a breakdown voltage and the recharging current creates a measurable signal quantifying the discharge event. Typically, the pulse shape associated with a single photo electron (SPE) signal has a fast rise time, followed by a long fall time. When such pulses are aggregated across numerous microcells, such as across large number of microcells forming a pixel of an SiPM device, the resulting pulse shape of the summed signal has a slow rise time (e.g., in the tens of nanoseconds) due to the convolution of single microcell responses with detected light pulse. Therefore, it is difficult to achieve good timing resolution with these devices due to the slow rise time of the aggregated signal for a given light pulse.

In one approach, to address this issue digital SiPMs are employed. In this approach, special electronic circuitry for each microcell (e.g., a SPAD) is produced on the same silicon wafer using a complementary metal-oxide semiconductor (CMOS) process. The function of this circuitry is to detect avalanche events and to actively quench the microcell. Each circuitry has a memory element (such as a 1 or more bit element). A special network tree is used to collect time stamps from all the microcells. To get the information of the number of detected photons per event a special read out cycle is executed, which requires a special digital controller for each digital SiPM. Such an approach is undesirably complex.

The present approach, as discussed herein solves the problems associated with long pulse analog signals generated using SiPMs without introducing the complexity of digital SiPMs. By way of example, in one implementation, a small electronic circuitry is created for each microcell during SiPM fabrication. This circuitry detects the avalanche development and generates a very short (e.g., approximately 0.2 ns to 2.0 ns) digital pulse in the readout network (i.e., a "one-shot") as opposed to the conventional analog pulse. This active sensing method ensures stable gain, low excess noise factor, and potentially higher photo detection efficiency (PDE). The present SiPM device provides fast SPE response, stable gain, and reduced temperature sensitivity. Further, use of the present SiPM device, as discussed herein, allows for simplified read out electronics and better energy and timing resolution for radiation detectors employing the present SiPMs.

Embodiments discussed herein relate to the readout of a detector in a nuclear imaging system, such as a positron emission tomography (PET) or single photon emission computed tomography (SPECT) imaging system or in a combined or hybrid imaging system including such PET or SPECT imaging functionality (e.g., a PET/MR, a PET/CT, or a SPECT/CT imaging system). It should be appreciated, however, that the present SiPM devices may also be employed in other types of imaging modalities or detectors used to detect radiation or nuclear particles, such as radiographic detectors used in X-ray based imaging modalities (e.g., fluoroscopy, mammography, computed tomography (CT), tomosynthesis, angiography, and so forth). However, to simplify explanation, and to facilitate discussion in the context of a concrete example, the present discussion will be provided in the context of a nuclear imaging system.

Figure 1:
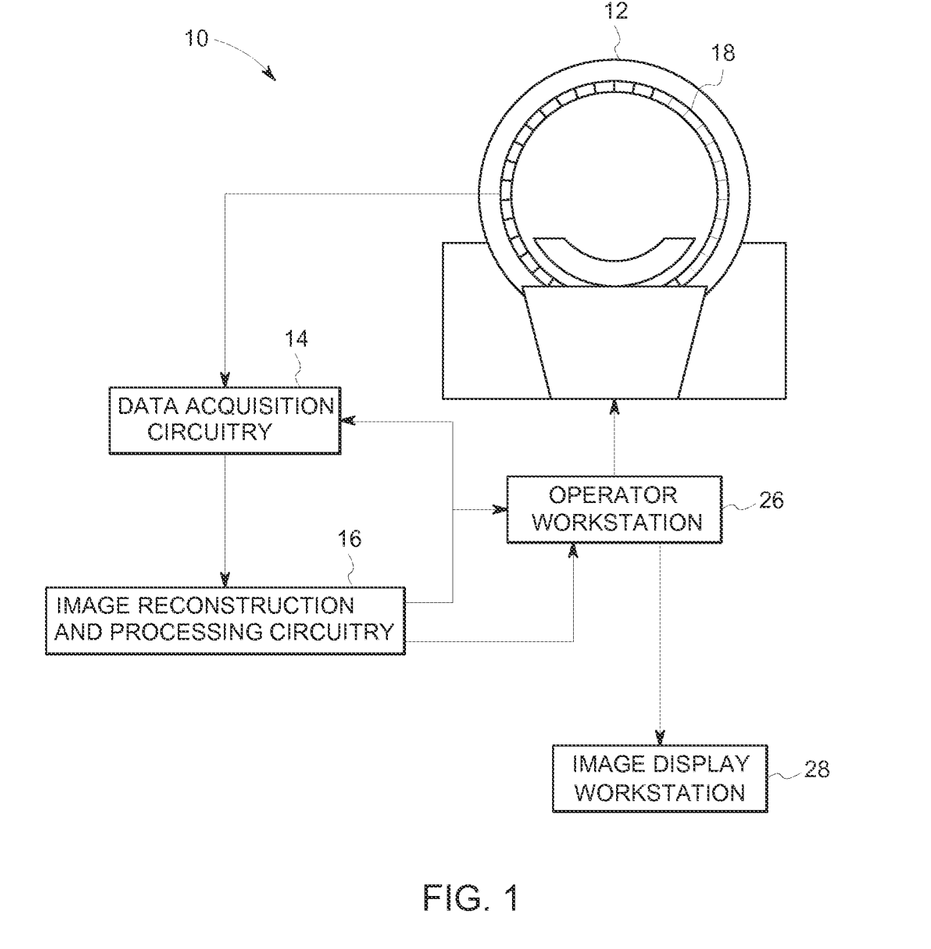
FIG. 1 is a diagrammatical representation of a PET imaging system in accordance with aspects of the present disclosure.

With the foregoing in mind and turning now to the drawings, FIG. 1 depicts a PET system 10 operating in accordance with certain aspects of the present disclosure. Though a PET system 10 is described and discussed herein, it should be appreciated that the present approach may also be useful in other imaging contexts, such as in a SPECT or CT imaging system.

The depicted PET system 10 includes a detector assembly 12, data acquisition circuitry 14, and image reconstruction and processing circuitry 16. The detector assembly 12 of the PET system 10 typically includes a number of detector modules (generally designated by reference numeral 18) arranged about the imaging volume, as depicted in FIG. 1. As discussed herein the detector assembly 12, via the modules 18, may be configured to generate signals in response to gamma rays generated by positron annihilation events and emitted from a subject within the imaged volume. In certain implementations, the detector assembly 12 can include scintillators and photon detection electronics. The detector assembly 12 may be of any suitable construction and configuration for acquiring PET data. For example, as in the depicted example, the detector assembly 12 can be configured as a full or partial ring.

In certain implementations, gamma rays may be converted, such as in a scintillator of the detector assembly 12 or detector modules 18, to lower energy photons that in turn may be detected and converted in the detector modules 18 to electrical signals, which can be conditioned and processed to output digital signals. In certain imaging applications, to overcome the low number of optical photons generated in response to impinging radiation at the scintillator (i.e., the low signal level), a solid state photomultiplier (SiPM) may be combined with a scintillator to provide amplification of the signals.

The signals generated by the detector modules 18 can be used to match pairs of gamma ray detections as potential coincidence events. That is, in such a PET implementation, when two gamma rays strike opposing detectors it may be determined that a positron annihilation occurred somewhere on the line connecting the two impact locations (absent the effects of interactions of randoms and scatter detections). In SPECT implementations, line of flight information may instead be inferred based at least in part on the collimation associated with the detector assembly. The collected data can be sorted and integrated and used in subsequent processing such as by image reconstruction and processing circuitry 16.

Thus, in operation, the detector acquisition circuitry 14 is used to read out the signals from the detector modules 18 of the detector assembly 12, where the signals are generated in response to gamma rays emitted within the imaged volume. The signals acquired by the detector acquisition circuitry 14 are provided to the image reconstruction and processing circuitry 16. The image reconstruction and processing circuitry 16 generates an image based on the derived gamma ray emission locations. The operator workstation 26 is utilized by a system operator to provide control instructions to some or all of the described components and for configuring the various operating parameters that aid in data acquisition and image generation. The operating workstation 26 may also display the generated image. Alternatively, the generated image may be displayed at a remote viewing workstation, such as the image display workstation 28.

It should be appreciated that, to facilitate explanation and discussion of the operation of the PET system 10, the detector acquisition circuitry 14 and the image reconstruction and processing circuitry 16 have been shown separately in FIG. 1 from other illustrated components (e.g., the detector assembly 12, the operator workstation 26, and the image display workstation 28). However, it should be appreciated that, in certain implementations, some or all of these circuitries may be provided as part of the detector assembly 12, the operator workstation 26, and/or the image display workstation 28. For example, the hardware, software, and/or firmware executed on or provided as part of the data acquisition circuitry 14, whether provided as part of the detector assembly 12, the operator workstation 26, and/or the image display workstation 28, may be used to perform various detector readout and/or control actions described herein. In certain implementations the data acquisition circuitry 14 may include specially configured or programmed hardware, memory, or processors (e.g., application-specific integrated circuits (ASICs)) for performing detector readout steps as discussed herein. Similarly, certain of these readout functions may be performed using one or more general or special purpose processors and stored code or algorithms configured to execute on such processors. Likewise, a combination of special purpose hardware and/or circuitry may be used in conjunction with one or more processors configured to execute stored code to implement the steps discussed herein.

With the preceding mind, the detector technology in one implementation of a system such as that depicted in FIG. 1 will be discussed in greater detail. In particular, a PET or SPECT system may utilize arrays of solid-state photo multiplier (e.g., SiPM) devices as part of the gamma ray detection mechanism, such as within detector modules 18. Such SiPM devices may take the form, in certain implementations, of an array of microcells (e.g., passively quenched Geiger-mode avalanche photodiodes (APD)) for detecting impinging photons. In general, SiPM devices used for photon detection can provide information about certain parameters, such as the time of the impingement event, the energy associated with the event, and the position of the event within the detector. These parameters can be determined through processing algorithms applied to the output signals generated by the SiPM.

In one embodiment, a multichannel readout front-end application-specific integrated circuit (ASIC) interfaces with an array of SiPMs in a PET (or SPECT) system. The ASIC may be provided as part of the data acquisition circuitry 14 of FIG. 1 and may be configured to provide information on the timing, energy, and location of events in each SiPM to a processing system (e.g., processing circuitry 16), as well as the ability to bias each SiPM.

Figure 2:
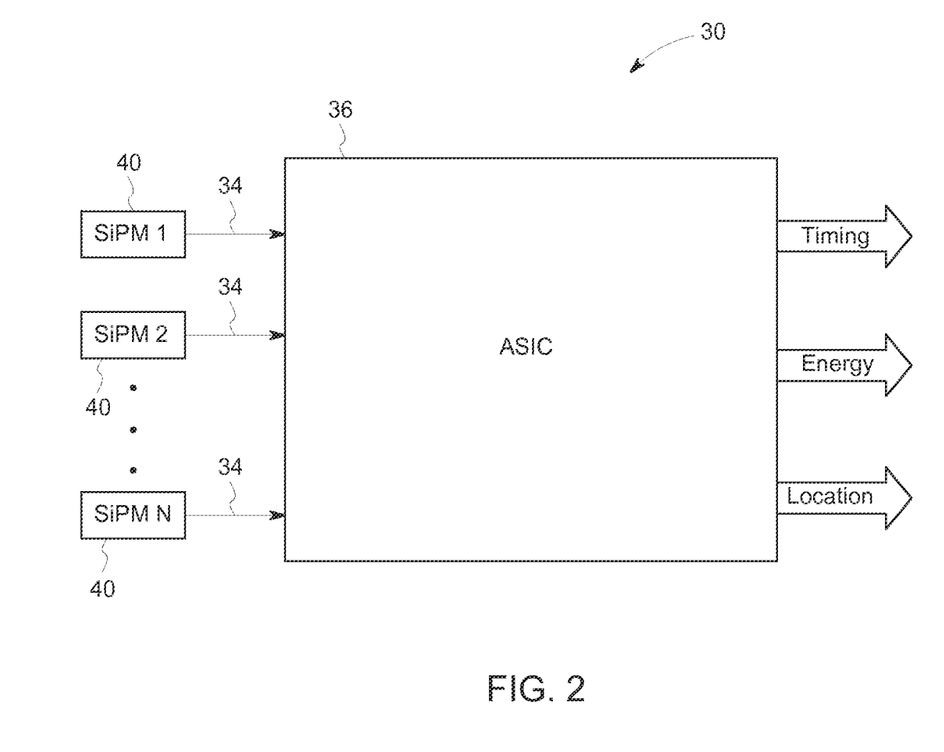
FIG. 2 is a block diagram of one example of a front-end for a PET data acquisition system, in accordance with aspects of the present disclosure.

Turning to FIG. 2, a block diagram is depicted representing one example of a front-end of a PET data acquisition system 30, such as may be used with the PET system 10 of FIG. 1. The PET data acquisition system 30 may include a plurality of SiPMs 40 as well as multiple ASICs 36 as part of the detector modules 18 and/or data acquisition circuitry 14. Light generated in a scintillator in response to a gamma ray interaction is detected by an SiPM and amplified. In this example, each SiPM 40 includes an anode output 34 in electrical communication with the ASIC 36. That is, the outputs of the SiPMs 40 are the inputs to the respective ASIC 36. The ASIC 36, in turn provides one or more timing signals, energy signals, and/or position signals as outputs. Each of these signals output by the ASIC 36 corresponds to information obtained from the respective SiPMs 40 after processing by the ASIC 36. By way of a non-limiting example, in one embodiment, a front-end of a data acquisition system 30 can include eighteen (18) SiPMs 40. However, in other implementations, other quantities of SiPMs 40 may be present within a data acquisition system 30.

Figure 3:
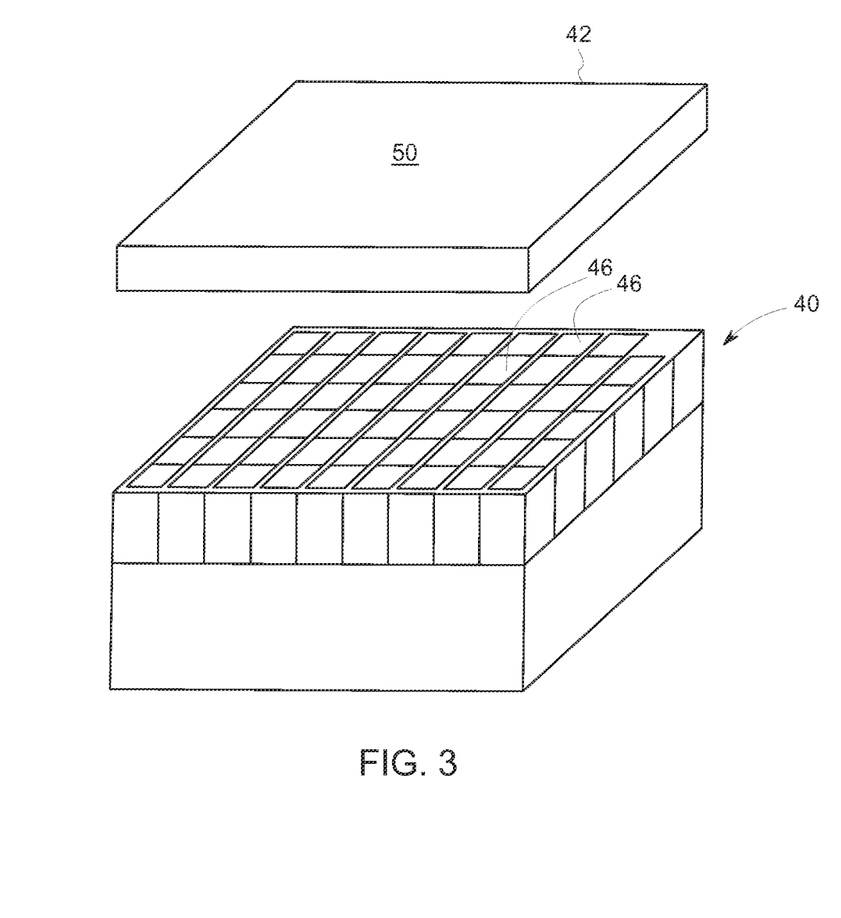
FIG. 3 depicts a perspective view of a detector element, in accordance with aspects of the present disclosure.

In certain implementations, each SiPM pixel 40 is formed using silicon as a semiconductor material, although other suitable semiconductor materials could instead be used (e.g. SiC, AlxGa1-xAs, GaP, GaN and its alloys, amongst others). As discussed herein each SiPM pixel 40 includes a plurality of macroscopic units, referred to as microcells. By way of illustration, a single SiPM 40 is shown in FIG. 3 to illustrate certain of the present concepts. The number of microcells 46 on a SiPM 40 is typically sufficient to provide effective dynamic range for the SiPM 40. The area of a SiPM 40 is sufficient to cover one or more crystal elements 50 formed on the scintillator 42. However, it should be appreciated that the exact number and density of the SiPMs 40 will be determined by image resolution desired by an operator and other known factors.

As depicted in FIG. 3, a single SiPM pixel 40 is comprised of a plurality of avalanche photodiodes (APDs) or "microcells" 46 that amplify single optical photon arrivals from the scintillator 42 into an output signal. Typically, each SiPM 40 will contain a large number of microcells 46 (e.g., between 100 to 2,500 APDs per $mm^2$) In certain embodiments, each of the microcells 46 may have a length of between 20 microns to 100 microns. In one implementation, each of the microcells 46 operates as an individual Geiger-mode APD a few volts above a breakdown voltage, with each microcell 46 being virtually identical to all the other microcells. In this mode of operation, an electron generated by the absorption of an optical photon initiates an avalanche breakdown that is confined to an individual microcell 46 when the one or more photons are absorbed by that microcell 46.

Each microcell 46 functions independently of the others to detect photons. A single discrete unit of electrical charge is emitted from the microcell 46 independent of the number of photons absorbed therein. That is, for each Geiger breakdown, the output signal of the microcell 46 will have substantially the same shape and charge. In one embodiment, the microcells are electrically connected in parallel to yield an integrated charge over some area over which the signals are being aggregated, such as a SiPM 40. The summed discharge currents of the microcells 46 are indicative of the incidence of radiation over a given area. This quasi-analog output is capable of providing magnitude information regarding the incident photon flux over the area for which signals are being aggregated.

Figure 4:
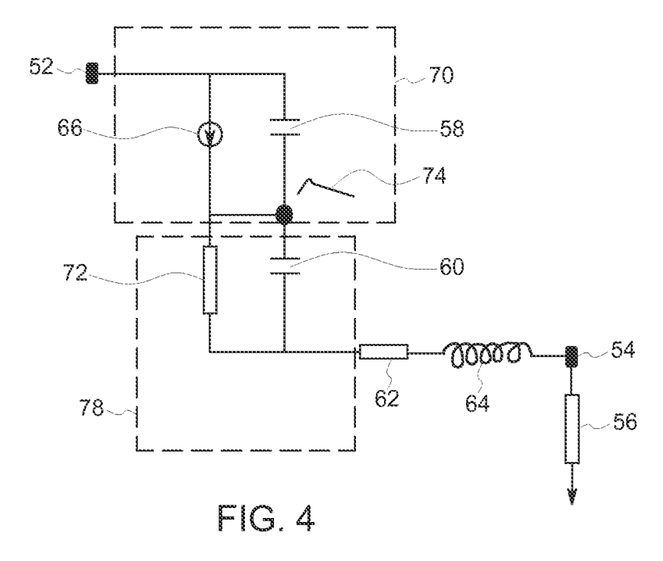
FIG. 4 depicts a simplified electrical model of a microcell signal generating path.

Turning to FIG. 4, an example of a simplified electrical model of a microcell 46 is depicted where the microcell is one of a plurality of microcells within an SiPM array of such cells. In one example, the depicted microcell may be part of an array of single photon avalanche diodes (SPAD) operated in Geiger mode within an analog SiPM. In the depicted example, the model has an associated cathode 52 and anode 54 and downstream load 56. The microcell portion 70 of the model includes a diode capacitor 58 and a current pulse 66, such as may be associated with a photodiode. Quench circuitry 78 in the depicted example includes a quench resistor 72 and a parasitic quench capacitor 60. Downstream of the quench circuitry 78, in this example, a parasitic resistor 62 and parasitic inductor 64 are modeled.

In this model each individual APD of a microcell 70, such as the depicted microcell, is connected to a readout network via the quenching circuitry 78, including the quenching resistor ($R_q$) 72 with typical values between about 100 kΩ to about 1 MΩ. When a detected photon generates an avalanche event, a pulse current 66 is generated and the microcell diode capacitance $C_d$ 58 discharges down to the breakdown voltage and the recharging current creates a measurable output signal. The typical pulse shape 74 of a single photo electron (SPE) signal has fast rise time (i.e., a sharp rising edge) followed by a long fall time (i.e., a slow falling tail).

Figure 5:
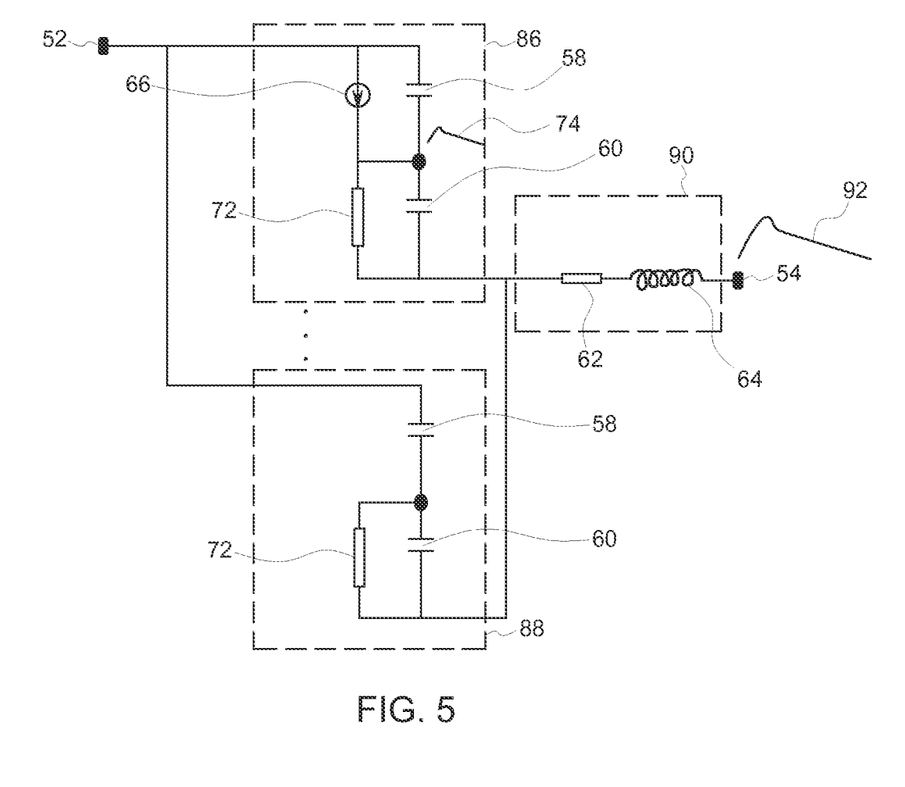
FIG. 5 depicts an example of signal summing using analog microcell signals.

Turning to FIG. 5, the conventional analog pulses 74 are output for summing, such as over a SiPM pixel. In FIG. 5, summing is depicted over a number of microcells, which for a given summing event, may include both firing microcells 86 as well as non-firing microcells 88 (for which no signal 74 is output). The resulting pulse shape of the aggregated signal 92 has a slow rise time (e.g., in the tens of nanosecond) due to convolution of single microcell response with detected light pulse, which yields poor time resolution. In the depicted example, the aggregation of the output signals may be subject to circuit parasitics 90 (e.g., parasitic resistor 62 and/or parasitic inductor 64).

In accordance with the present approach, a small electronic circuitry is incorporated into the circuit for each microcell 46 (e.g., a SPAD) during fabrication of the SiPM 40. This circuitry detects the avalanche development and generates a short digital pulse (e.g., between approximately 0.2 ns to 2.0 ns, such as about 1 ns or less) in the readout network (e.g., a "one-shot").

Figure 6:
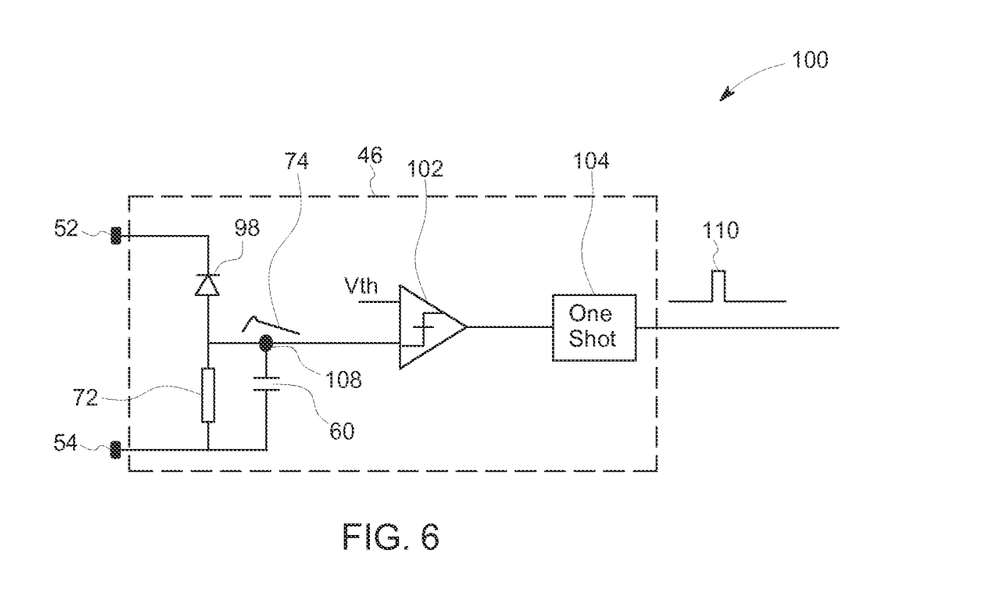
FIG. 6 depicts a circuit-type view of a microcell signal generating path in accordance with aspects of the present disclosure.

By way of example, and turning to FIG. 6, a circuit diagram 100 of one example of a microcell circuit having an avalanche photodiode 98 in accordance with the present approach is depicted. In this example, the microcell 46 incorporates integrated electronics sensing. In accordance with this circuit, the pulse 74 from the firing microcell 46 is the same as what is seen in a conventional microcell, i.e., a sharp rising edge with a slow falling tail. However, a comparator 102, such as a Schmitt trigger, followed by a one-shot pulse generator 104 is provided in the circuit 100 to sense the signal at a signal sensing node 108. In the depicted example, the comparator 102 compares the signal sensed at the signal sensing node 108 with a threshold voltage ($V_{th}$). That is, the circuit 100 operates in a voltage mode in terms of the determination as to whether the one-shot pulse generator 104 is triggered. In the depicted example, the digital one-shot pulse generator 104 is triggered in response to the output of the comparator 102 (i.e., does the signal at the signal sensing node 108 exceed the threshold voltage $V_{th}$, if so generate a one-shot pulse, if not, do nothing). In one implementation, the generated pulse is a short duration (e.g., approximately 1 ns or less) digital pulse 110 (such as square waveform) provided for summing over some area (e.g., at the SiPM level) instead of summing the analog pulses conventionally provided (e.g., pulses 74) as output. As will be appreciated, though a square waveform is depicted by way of example, the digital pulse 110 may take non-square forms, such as a Gaussian or triangular waveform, or any other suitable predetermined waveform type. As will be appreciated, the amplitude and duration of the digital pulse 110 are fixed by design. This is in contrast to analog pulses, such as pulse 74 where the amplitude of the analog pulse depends in part on $V_{br}$ which is sensitive to temperature.

The resulting waveform generated by the summing of the one-shot pulses from the multiple microcells 46 present in an SiPM 40 is a convolution of short duration digital pulses 100, such as square (or Gaussian or triangular or any other predetermined shape) waveform (as opposed to long-tailed, analog pulses 74). As a result, the summed, or otherwise aggregated, digital pulses 100 provide a signal output having a short rise time (as opposed to the summed analog signals) with reduced rise time associated with scintillator pulses.

Figure 7:
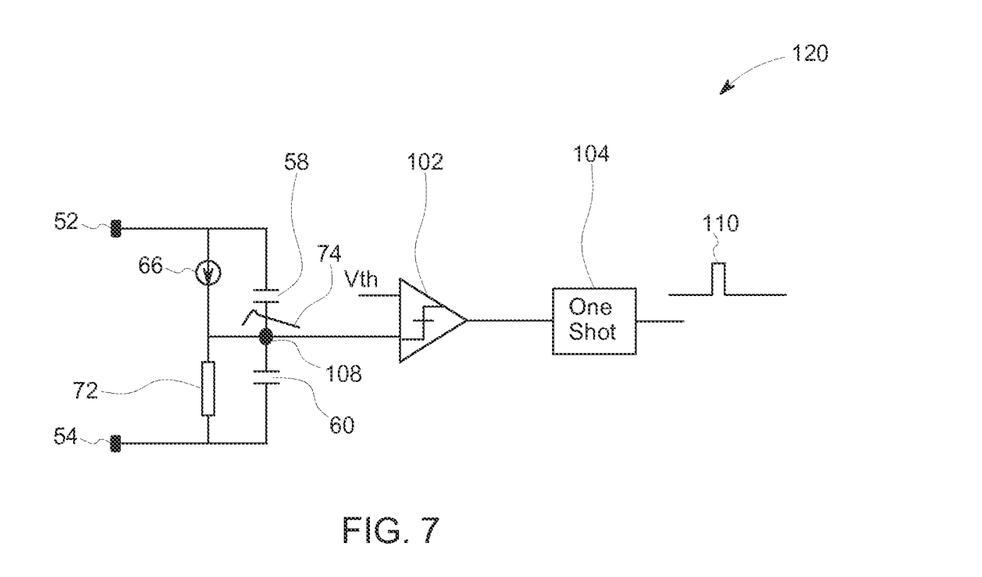
FIG. 7 depicts a simplified electrical model of a firing microcell in accordance with aspects of the present disclosure.

Turning to FIG. 7, a simplified electrical model 120 is shown corresponding to the circuit 100 of FIG. 6. As depicted in this model, the pulse 74 sensed at the signal-sensing node 108 is used as an input to the comparator 102 (e.g., a Schmitt trigger). The output of the comparator 102 determined whether the one-shot pulse generator 104 is triggered during a given readout based on a comparison to the threshold voltage ($V_{th}$). If triggered, the one-shot pulse generator 104 generates a digital pulse 110 as an output to a downstream summing node.

Figure 8:
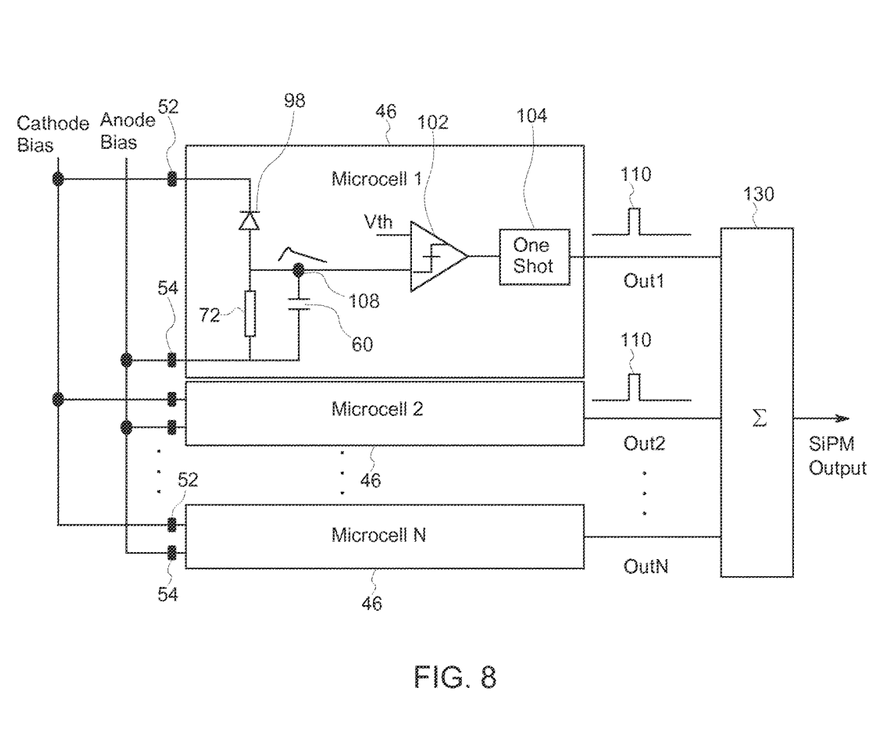
FIG. 8 depicts an example of signal summing using digital microcell signals in accordance with aspects of the present disclosure.

By way of example, FIG. 8, a series or array (i.e., 1–N) of microcells 46 is depicted. To simplify the depiction, only the components of the first microcell are shown in detail. In this example, the various digital pulse outputs of the microcells 46 are aggregated and summed, such as an summing circuitry 130, and provided as an output of an SiPM 40 during detector readout.

Figure 9:
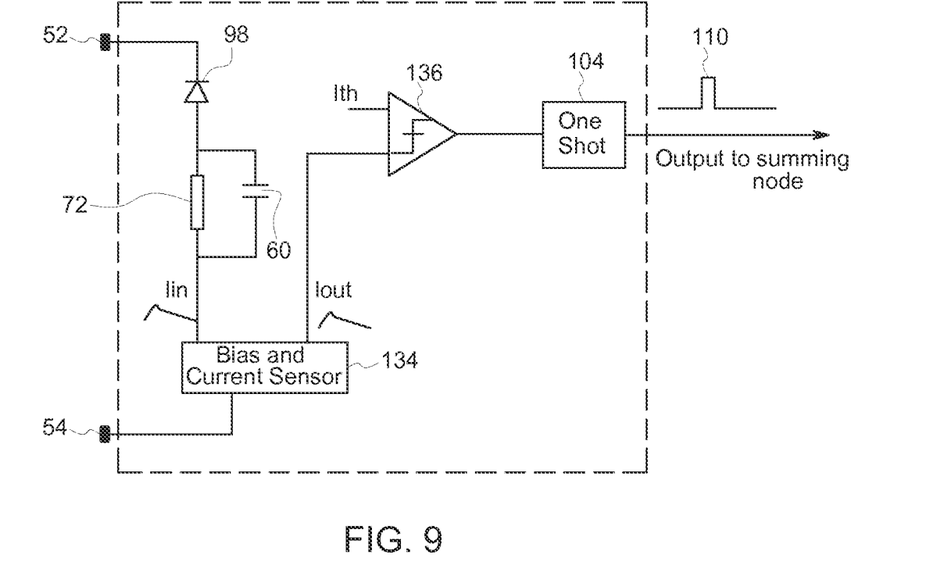
FIG. 9 depicts an alternative circuit-type view of a microcell signal generating path in accordance with aspects of the present disclosure.

While the preceding discussion generally relates to a voltage-mode of operation, in other embodiments a current-mode of operation may be employed. By way of example, and turning to FIG. 9, a microcell 46 is depicted that is suitable for use in a SiPM 40 and that incorporates electronic sensing in a current-mode. In this example, a bias and current sensing component 134 is included in the microcell 46. The bias and current sensing component 134 provides bias to the avalanche photodiode 98 and senses the current flowing through the avalanche photodiode 98, shown as $I_{in}$ in FIG. 9. The bias and current sensing component 134 in turn outputs a current $I_{out}$ to a current comparator 136. Similar to the voltage comparator, the current comparator 136 compares the current received from the bias and current sensor 134 to a threshold current $I_{th}$. Based upon this comparison, a one-shot pulse generator 104 is triggered or not during a readout interval. If triggered, the one-shot pulse generator 104 generates a digital pulse 110 of short duration, e.g., a square (or Gaussian or triangular) waveform having a duration less than 2.0 ns or 1 ns, as an output to a summing node within the SiPM.

Figure 10:
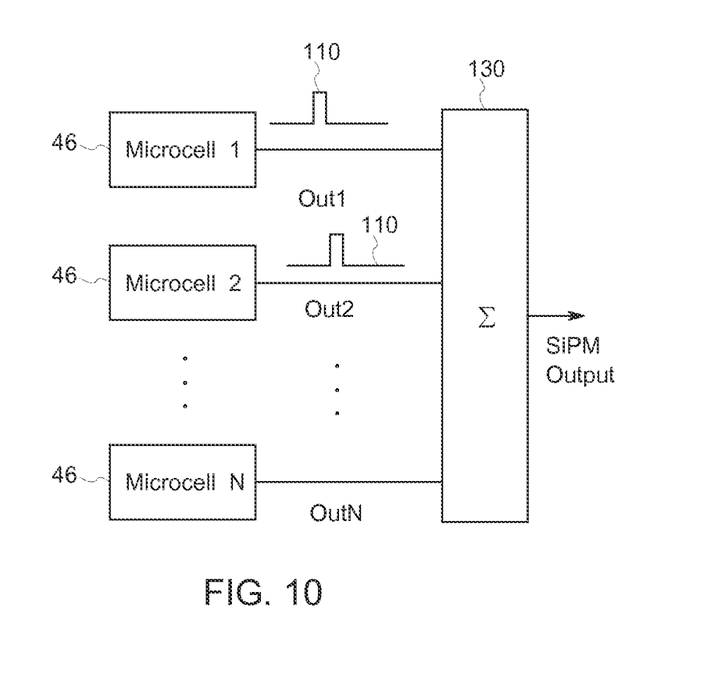
FIG. 10 depicts a generalized example of signal summing using digital microcell signals in accordance with aspects of the present disclosure.

With the foregoing discussion in mind, a generalize architecture for microcells with integrated electronics summed within a pixel is depicted in FIG. 10. In this example, the microcells 46 (1–N) within a pixel array incorporate electronics and can operate in either a voltage-mode or a current-mode, as discussed above. Further, in certain embodiments different microcells 46 within the array may operate in different modes. For example, certain of the microcells 46 may operate in a voltage-mode while others operate in a current-mode. Alternatively, a microcell 46 may incorporate the necessary circuitry to operate in either mode and may thereby be switchable between modes based on a system or user instruction.

As depicted in this example, the digital pulse outputs 110 of the microcells 46 may be provided to a summing circuit or component within SiPM 40 during a readout operation. The summed digital pulse outputs may in turn be provided as an output of SiPM 40.

Technical effects of the invention include, but are not limited to, an SiPM having fast single photo electron response, stable gain, and reduced temperature sensitivity. Technical effects also include improved energy and timing resolution. Technical effects also include microcells for use in a solid state photomultiplier, where the microcells can output digital pulses operating in a current-mode or in a voltage mode.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

The invention claimed is:

1. A radiation detector module, comprising:
   a scintillator layer configured to generate photons in response to incident radiation;
   a solid state photomultiplier, wherein the solid state multiplier is a silicon photomultiplier (SiPM) pixel and the SiPM pixel comprises a plurality of microcells, wherein each microcell, in response to photons generated by the scintillator, is configured to generate a digital pulse signal having a duration between 0.2 ns to 2 ns,
   wherein the digital pulse signal is generated in a respective microcell in response to an initial analog signal exceeding a threshold voltage or current,
   wherein each microcell comprises:
      a comparator configured to compare the initial analog signal to the threshold voltage or current and to generate an output signal if the initial analog signal exceeds the threshold voltage or current; and
      a one-shot generator configured to generate the digital pulse signal in response to the output signal.

2. The radiation detector module of claim 1, wherein the solid state photomultiplier is configured to sum the respective digital pulse signals to generate a summed signal.

3. The radiation detector module of claim 1, wherein the comparator comprises a Schmitt trigger.

4. The radiation detector module of claim 1, wherein the solid state photomultiplier comprises a silicon photomultiplier.

5. The radiation detector module of claim 1, wherein the microcells comprise avalanche photodiodes.

6. The radiation detector module of claim 1, wherein the plurality of microcells within each solid state photomultiplier comprises between 100 to 2,500 microcells per mm².

7. The radiation detector module of claim 1, wherein the digital pulse signal comprises a square, triangular, Gaussian, or any other predetermined waveform.

8. A solid state photomultiplier, wherein the solid state multiplier is a silicon photomultiplier (SiPM) pixel and the SiPM pixel comprises:
   a plurality of microcells, wherein each microcell is configured to generate an initial analog signal when exposed to optical photons and wherein, the microcell is configured to generate a digital output signal having a duration of between 0.2 ns to 2 ns based on a comparison of the initial analog signal to a comparison parameter,
   wherein each microcell comprises a circuit that includes at least:
      a comparator configured to sample the initial analog signal at a first node and to compare the initial analog signal to the comparison parameter; and
      a one-shot generator configured to generate the digital output signal based on an output generated by the comparator.

9. The solid state photo multiplier of claim 8, wherein the solid state photomultiplier is configured to sum the digital output signals generated by the microcells to generate summed signals.

10. The solid state photomultiplier of claim 8, wherein the comparator comprises a Schmitt trigger.

11. The solid state photomultiplier of claim 8, wherein the comparison parameter comprises a threshold voltage or current.

12. The solid state photomultiplier of claim 8, wherein the digital output signal comprises a square, triangular, Gaussian, or any other predetermined waveform.

13. An imaging system, comprising:
   a detector panel comprising a plurality of solid state photomultiplier modules, wherein each photomultiplier module is a silicon photomultiplier (SiPM) pixel and the SiPM pixel comprises a plurality of microcells, wherein each microcell comprises:
      a comparator configured to compare an initial analog signal generated by the respective microcell to a comparison threshold; and
      a digital pulse generator configured to generate a digital pulse in response to an output of the comparator, wherein the digital pulse has a duration of between 0.2 ns to 2 ns;
   data acquisition circuitry configured to acquire output signals from the detector panel, wherein the output signals are derived using the digital pulses aggregated over respective solid state photomultipliers;
   image reconstruction and processing circuitry configured to generate images based on the output signals acquired by the data acquisition circuitry; and
   at least one image display workstation configured to display the images.

14. The imaging system of claim 13, wherein the imaging system comprises one of a positron emission tomography (PET) imaging system, a single photon emission computed tomography (SPECT) imaging system, or an X-ray based imaging system.

15. The imaging system of claim 13, wherein the comparator comprises a Schmitt trigger.

16. The imaging system of claim 13, wherein the digital pulses comprises square, triangular, Gaussian, or any other predetermined waveforms.

* * * * *